(12) United States Patent
Benisek et al.

(10) Patent No.: US 6,839,241 B2
(45) Date of Patent: Jan. 4, 2005

(54) CIRCUIT MODULE

(75) Inventors: Martin Benisek, München (DE); Wolfgang Hoppe, Bad Tölz (DE); Martin Schober, Gröbenzell (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/143,627

(22) Filed: May 10, 2002

(65) Prior Publication Data

US 2002/0167803 A1 Nov. 14, 2002

(30) Foreign Application Priority Data

May 10, 2001 (DE) .......................... 101 22 701

(51) Int. Cl.[7] .......................... H05K 7/02; H05K 7/06; H05K 7/08; H05K 7/10
(52) U.S. Cl. ...................... 361/760; 361/764
(58) Field of Search ................ 361/760–765, 361/803–804, 766, 782, 783, 784; 365/51–52, 63; 257/723–724

(56) References Cited

U.S. PATENT DOCUMENTS

| | | | | |
|---|---|---|---|---|
| 4,788,523 A | * | 11/1988 | Robbins ..................... 338/309 |
| 5,164,916 A | * | 11/1992 | Wu et al. ..................... 365/52 |
| 5,307,309 A | * | 4/1994 | Protigal et al. ............... 365/63 |
| 5,391,922 A | * | 2/1995 | Matsui ....................... 257/773 |
| 5,504,373 A | * | 4/1996 | Oh et al. .................... 257/734 |
| 5,513,135 A | * | 4/1996 | Dell et al. ................... 365/52 |
| 5,668,834 A | | 9/1997 | Takekuma et al. |
| 5,841,686 A | * | 11/1998 | Chu et al. .................... 365/51 |
| 5,955,889 A | | 9/1999 | Taguchi et al. |
| 5,982,192 A | * | 11/1999 | Saito .......................... 326/30 |
| 6,115,278 A | * | 9/2000 | Deneroff et al. .............. 365/52 |
| 6,377,464 B1 | * | 4/2002 | Hashemi et al. ............. 361/760 |

* cited by examiner

Primary Examiner—Kamand Cuneo
Assistant Examiner—Tuan Dinh
(74) Attorney, Agent, or Firm—Laurence A. Greenberg; Werner H. Stemer; Gregory L. Mayback

(57) ABSTRACT

A circuit module comprises a circuit board having a plurality of contact elements along a longitudinal edge thereof. The circuit board has arranged thereon a SDRAM memory component, the connections of this SDRAM memory component being each connected via resistance elements, which are implemented as individual resistors, to one of the contact elements through lines of limited length. The individual resistors are arranged in a line which extends parallel to the longitudinal direction of the circuit board.

5 Claims, 2 Drawing Sheets

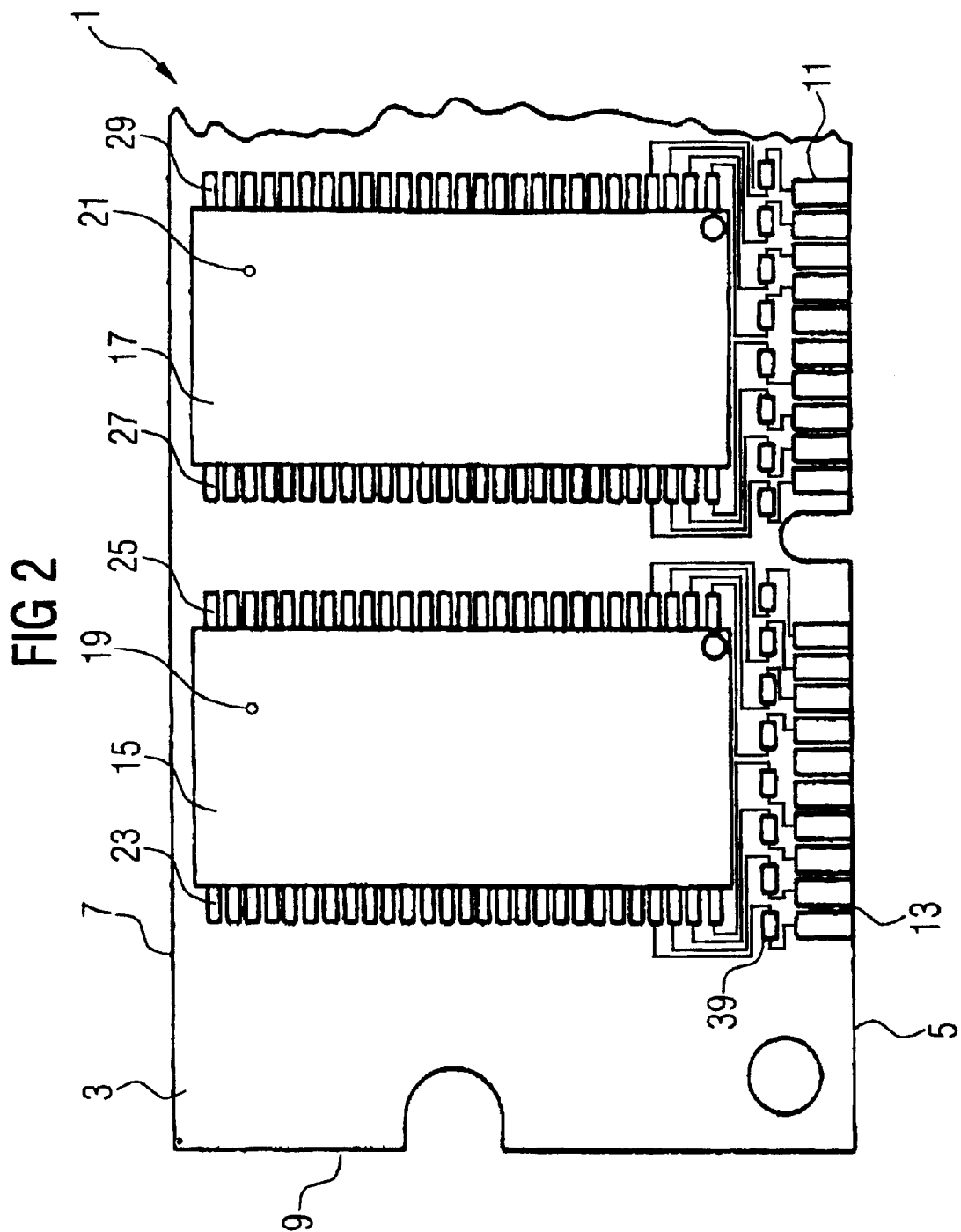

CIRCUIT MODULE

BACKGROUND OF THE INVENTION

1. Field of the Invention

The present invention deals with a circuit module. In particular, the present invention deals with a DRAM module comprising a plurality of DRAM memory components which are arranged on a printed circuit board or circuit board and the connections of which are connected via resistors to contact elements of the printed circuit board of the circuit module.

2. Description of Prior Art

Circuit modules and especially DRAM modules or SDRAM modules consist typically of a printed circuit board provided with a plurality of contact elements arranged along the longitudinally extending edge of the printed circuit board. In the case of circuit modules of this type, a plurality of integrated circuit components, such as DRAM modules or SDRAM modules or DDR-SDRAM modules, are arranged on the printed circuit board. SDRAM modules, i.e. single DRAM modules, represent the present standard in the case of dynamic RAM modules. DDR-SDRAM modules, i.e. double data rate DRAM modules, represent a new technology which, at present, is used more and more frequently in the field of computers. In spite of their different technologies, SDRAM modules and DDR-SDRAM modules have, typically, identical types of housings. When, and this is often desired for reasons of costs, these memory components are housed in so-called standard TSOP housings, these housings of the memory components have a size determining the overall size of the circuit module. In general, the design engineer developing such a circuit module will endeavour to keep primarily the dimensions of the printed circuit board in the width direction of the board as compact as possible, i.e. in a direction perpendicular to the longitudinal direction determined by the arrangement of the contact elements. This has the effect that the integrated circuit components extend in the width direction of the printed circuit board from the longitudinally extending edge located opposite the contact elements across most of the width of the printed circuit board. The circuit components have two rows of connections. In the case of DRAM memory components or SDRAM memory components, each of the connections used for the signal lines, which are also referred to as DQ lines, must be connected via a respective resistance element to a respective associated contact element through suitable connecting lines.

According to the specification of DRAM memory modules or SDRAM memory modules, restrictive length limitations for these connecting lines must here be observed. As will clearly be explained hereinbelow making reference to the embodiment of a prior art circuit module shown in FIG. 1, these length limitations of the connecting lines resulting from the specification of the DRAM memory modules or SDRAM memory modules lead to certain restrictions of the freedom to arrange the resistance elements and the circuit components on the printed circuit board; these restrictions have, in turn, the effect that, in the prior art, a more far-reaching reduction of the dimensions of the printed circuit board in the direction of the width of the board is not possible.

This problem will now be discussed in detail making reference to FIG. 1, which shows a top view of certain sections of a circuit module designated generally by reference numeral 1. The circuit module includes a printed circuit board 3 having a lower longitudinally extending edge 5, an upper longitudinally extending edge 7 and an edge 9 extending in the width direction. Along the lower longitudinally extending edge 5, a multipoint connector 11 is formed, which comprises a plurality of contact elements 13, which, when the multipoint connector 11 of the circuit module 1 is being inserted into a plug-contact reception means (not shown), lead to contact making with mating contact elements (not shown either). The printed circuit board 3 has arranged thereon a plurality of integrated SDRAM circuit components 15, 17, each of these SDRAM circuit components 15, 17 having, in turn, a so-called standard TSOP housing 19, 21 provided with a plurality of connections 23, 25, 27, 29 along each of its longitudinal edges.

Part of these connections 23, 25, 27, 29 of the SDRAM circuit components 15, 17 represent connections to signal lines or DQ data lines. Each of these signal-line connections 23, 25, 27, 29 is connected via a respective resistance element of an integrated resistor array component 31, 33, 35, 37 to a respective one of the contact elements 13 of the multipoint connector 11.

The specification of the SDRAM circuit components 15, 17 demands very short lengths of the lines (not shown) leading from the respective contact element 13 via one of the resistance elements of the resistor array components 31, 33, 35, 37 to one of the contact elements 13 provided for the signal lines. These length limitations can only be observed when the resistor array components 31, 33, 35, 37 are arranged in the area of the printed circuit board located between the edge of the SDRAM circuit component 15, 17 defining the lower edge in FIG. 1 and the contact elements 13. These requirements are opposed to a further reduction of the circuit module dimensions in the width direction 9 of the circuit module.

SUMMARY OF THE INVENTION

It is the object of the present invention to further develop a circuit module of the type mentioned at the start in such a way that a reduction of the dimensions of the circuit module in the width direction of its printed circuit board is achieved, perpendicularly to the direction of the edge along which the plurality of contact elements is arranged.

In accordance with a first aspect of the present invention this object is achieved by a circuit module comprising a circuit board provided with a plurality of contact elements arranged along one of its edges extending in the longitudinal direction of the circuit board and an integrated circuit component arranged on the circuit board and extending in the width direction of the circuit board from the other longitudinally extending edge across most of the width of the circuit board, said integrated circuit component being provided with a plurality of connections. Furthermore, the circuit board comprises a plurality of resistance elements located on said circuit board between the circuit component and the contact elements, each of said resistance elements being connected via lines of limited length to one of the contact elements and one of the connections, wherein the resistance elements are defined by individual resistors which are arranged on the circuit board in a line extending substantially parallel to the longitudinal direction.

The present invention is so conceived that the plurality of resistance elements, which are located on the printed circuit board between the circuit component and the contact elements and each of which is connected by a line of limited length to one of the contact elements and one of the connections, are no longer defined by resistor arrays defining within a component a plurality of resistors—as is common practice in the prior art—but by individual resistors arranged on the printed circuit board in a line extending substantially parallel to the longitudinal direction.

This approach described by the present invention is, at first glance, diametrically opposed to the conventional design criteria for highly integrated circuit modules, since, not least for reasons of assembly times, it is normally endeavoured not to use individual elements and to use, as far as possible, integrated circuits, such as resistor arrays, comprising a plurality of individual elements. The present invention, however, realized that it is possible to observe the length limitations for the respective lines, which are predetermined by the specification of the circuit components, and to reduce the dimensions of the printed circuit board of the circuit module in the direction of the width of the circuit module, when the resistance elements, which are implemented as resistor arrays in the prior art, are replaced by individual resistors, since, in comparison with a resistor array, the individual resistors have lower dimensions in the direction of the width of the printed circuit board so that the-circuit component can be positioned closer to the contact elements located in opposed relationship therewith.

BRIEF DESCRIPTION OF THE DRAWINGS

In the following, a preferred embodiment of the present invention will be explained in detail making reference to the drawings enclosed, in which:

FIG. 2 shows a top view of a circuit module according to the present invention.

Figure 1:
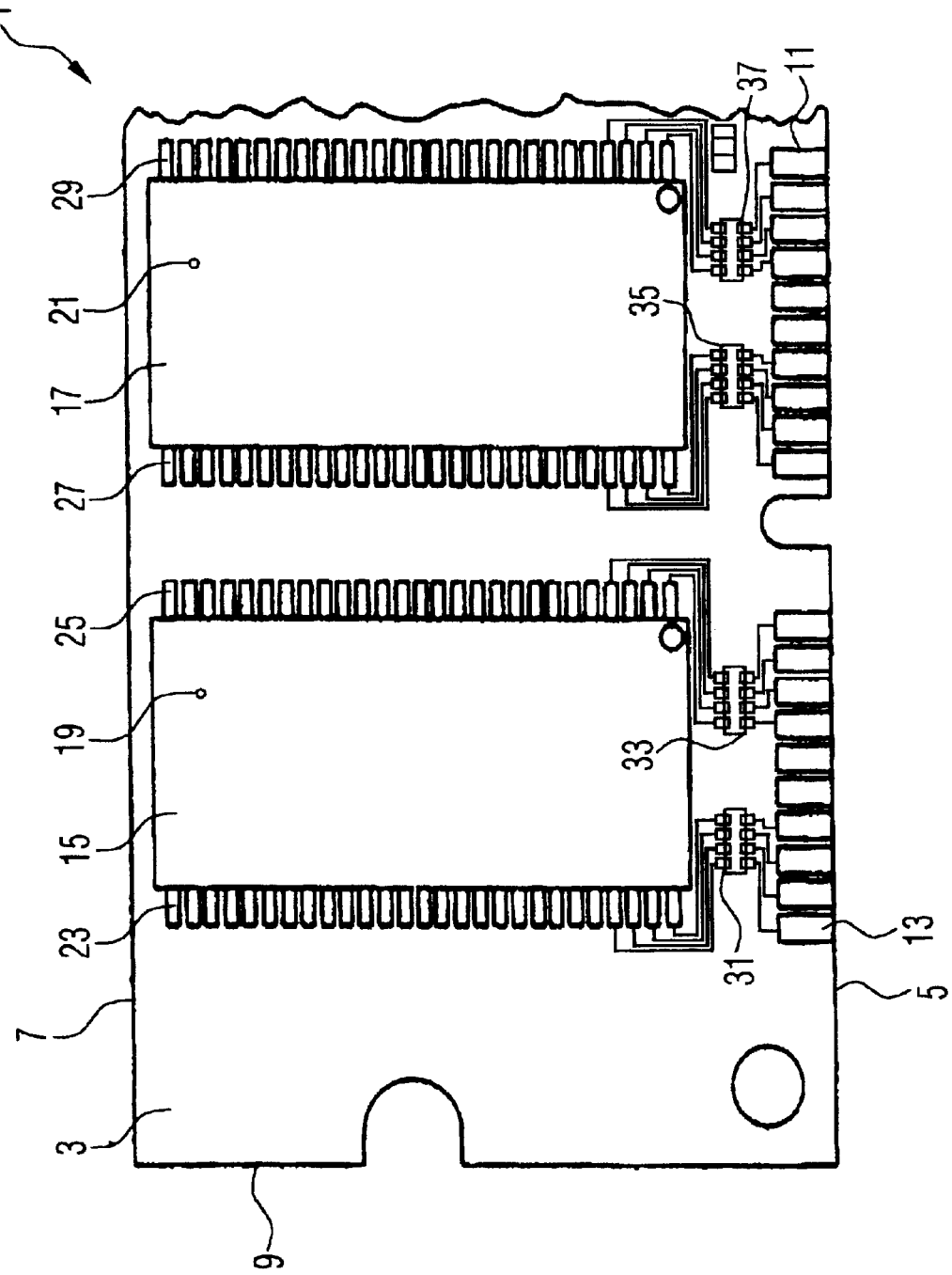
FIG. 1 shows a top view of a prior art circuit module.

DESCRIPTION OF PREFERRED
EMBODIMENTS OF THE INVENTION

In FIGS. 1 and 2, corresponding elements are designated by identical reference numerals so that the elements which have already been explained making reference to FIG. 1 need not be described again. As can be seen from the top view of FIG. 2, when compared with the top view of FIG. 1, the embodiment according to FIG. 2 of the present invention is so conceived that a plurality of individual resistors 39 is provided instead of the resistor arrays 31, 33, 35, 37 used in the prior art according to FIG. 1, the individual resistors 39 being arranged on the printed circuit board 3 in a line extending substantially parallel to the longitudinal direction. On the basis of this mode of arrangement, the lower edges of the two SDRAM circuit components 15, 17 can be arranged closer to the contact elements 13 in the embodiment according to the present invention disclosed in FIG. 2, whereby the dimensions of the printed circuit board 3 can be reduced in the direction of the width 9 of the printed circuit board. This is of essential economic importance, since the dimensions of the circuit module 1 are reduced in the width direction by the measures according to the present invention, without any necessity for replacing the comparatively large, standard TSOP housings 19, 21 of the SDRAM circuit components 15, 17 by more compact, but much more expensive housings so as to achieve the reduced overall dimensions of the circuit module in the width direction of the circuit module.

It follows that the concept according to the present invention permits the use of normal standard memory components with the so-called TSOP housings so that also the development of new production processes can be dispensed with and conventional standard processes can be used. On the basis of the arrangement of the resistance elements, which are defined by individual resistors, according to the present invention, the so-called vertical placement of the DRAM circuit components or SDRAM memory components or DDR-SDRAM memory components as well as the maximum connection lengths of the lines demanded by the specification of these memory components can be maintained.

In the embodiment according to FIG. 2, the individual resistors are preferably arranged in such a way that their longitudinal dimensions extend substantially parallel to the longitudinal direction 5 of the printed circuit board 3. This mode of arrangement contributes to a particularly far-reaching reduction of the dimensions of the printed circuit board 3 in the direction of the width of the printed circuit board.

What is claimed is:

1. A circuit module, comprising:

a circuit board provided with edges extending in a longitudinal direction of said circuit board and an edge extending in a width direction of said circuit board, said circuit board having a plurality of contact elements arranged along one of said edges extending in the longitudinal direction of said circuit board;

an integrated circuit component arranged on said circuit board and extending in the width direction of said circuit board from the other longitudinally extending edge across most of the width of said circuit board, said integrated circuit component being provided with a plurality of connections; and a plurality of resistance elements located on said circuit board between said circuit component and said contact elements, each of said resistance elements being connected via lines of limited length to one of said contact elements and one of said connections;

said resistance elements being defined by individual resistors disposed on said circuit board in a line extending substantially parallel to the longitudinal direction.

2. A circuit module according to claim 1, wherein said individual resistors are arranged in such a way that the longitudinal dimensions of said individual resistors extend substantially parallel to the longitudinal direction of said circuit board.

3. A circuit module according to claim 1, wherein said integrated circuit component is arranged on said circuit board in such a way that said connections of said integrated circuit component extend in a form of rows parallel to the edge extending in the width direction.

4. A circuit module according to claim 1, wherein said circuit component is a DRAM memory component.

5. A circuit module according to claim 4, wherein said DRAM memory component is a SDRAM memory component or a DDR-SDRAM memory component.

* * * * *